United States Patent [19]
Katata et al.

[11] Patent Number: 6,048,791
[45] Date of Patent: Apr. 11, 2000

[54] SEMICONDUCTOR DEVICE WITH ELECTRODE FORMED OF CONDUCTIVE LAYER CONSISTING OF POLYSILICON LAYER AND METAL-SILICIDE LAYER AND ITS MANUFACTURING METHOD

[75] Inventors: Tomio Katata; Katsuya Okumura, both of Yokohama, Japan

[73] Assignee: Kabushiki Kaisha Toshiba, Kawasaki, Japan

[21] Appl. No.: 09/050,357

[22] Filed: Mar. 31, 1998

[51] Int. Cl.⁷ .................... H01L 21/44; H01L 21/4763
[52] U.S. Cl. .................... 438/655; 438/656; 438/648; 438/649; 438/664; 438/682; 438/683; 438/660
[58] Field of Search .................... 438/655, 656, 438/658, 648, 649, 664, 682, 683, 685, 660

[56] References Cited

U.S. PATENT DOCUMENTS

| | | | |
|---|---|---|---|
| 4,783,248 | 11/1988 | Kohlhase et al. | 204/192.17 |
| 4,784,973 | 11/1988 | Stevens et al. | 437/200 |
| 5,070,038 | 12/1991 | Jin | 437/200 |
| 5,138,432 | 8/1992 | Stanasolovich et al. | 357/71 |
| 5,171,412 | 12/1992 | Telieh et al. | 204/192.15 |
| 5,173,450 | 12/1992 | Wei | 437/200 |
| 5,275,715 | 1/1994 | Tuttle | 205/123 |
| 5,378,660 | 1/1995 | Ngan et al. | 437/247 |
| 5,391,520 | 2/1995 | Chen et al. | 437/200 |
| 5,451,545 | 9/1995 | Ramaswami et al. | 437/200 |
| 5,504,043 | 4/1996 | Ngan et al. | 437/247 |
| 5,510,295 | 4/1996 | Cabral, Jr. et al. | 437/200 |
| 5,512,516 | 4/1996 | Nishida et al. | 437/200 |
| 5,550,079 | 8/1996 | Lin | 437/56 |
| 5,793,111 | 8/1998 | Zamanian | 257/751 |

*Primary Examiner*—John F. Niebling
*Assistant Examiner*—Neal Berezny
*Attorney, Agent, or Firm*—Banner & Witcoff, Ltd.

[57] ABSTRACT

A first TiSix layer is deposited on a polysilicon layer, then a silicon substrate is annealed in a vacuum atmosphere to crystallize the TiSix layer, and a second TiSix layer is provided on the first crystallized TiSix layer.

36 Claims, 5 Drawing Sheets

6,048,791

SEMICONDUCTOR DEVICE WITH ELECTRODE FORMED OF CONDUCTIVE LAYER CONSISTING OF POLYSILICON LAYER AND METAL-SILICIDE LAYER AND ITS MANUFACTURING METHOD

BACKGROUND OF THE INVENTION

This invention relates to a semiconductor device with a gate electrode formed of a conductive layer which consists of a polysilicon layer and a metal-silicide layer, and a method for manufacturing the semiconductor device.

To reduce the resistance of a polysilicon gate electrode or a polysilicon wiring layer, metal-silicide such as TiSix is provided on polysilicon in MOS semiconductor devices. This structure is obtained by sequentially depositing polysilicon and TiSix on a gate oxide film.

It is generally known that a laminated structure of TiSix and polysilicon is not stable at a high temperature, since TiSix grains enter polysilicon and the resultant TiSix layer is divided into portions when they grow. This phenomenon is generally called as an "inversion or agglomeration phenomenon". If such a phenomenon occurs at a gate electrode, the sheet resistance of the gate electrode becomes extremely high, and the quality of the gate oxide film is degraded.

Referring to FIGS. 1A and 1B, the inversion phenomenon will be described. As is shown in FIG. 1A, a TiSix layer 32 is formed on a polysilicon layer 31 by DC sputtering at a temperature of, for example, 300° C. or less. At this time, the TiSix layer 32 is in an amorphous state. Subsequently, the TiSix layer 32 is crystallized in a process in which an SiN layer (not shown) is deposited using the LP-CVD, or in a process in which a side-wall of a gate electrode is oxidized at high temperature. During the crystallization and the grain growth, the grains of the TiSix layer 32 enter the polysilicon layer 31 and also the layer 32 is divided into potions, as is shown in FIG. 1B. Experiments show significant variations in the sheet resistance of the TiSix layer, which resulted from the inversion or agglomeration phenomenon caused by the high temperature process.

FIG. 2 is a perspective view, showing a state seen while a gate electrode consisting of polysilicon and TiSix is formed on a gate oxide film by the conventional method. As is shown in FIG. 2, a polysilicon layer 42, a TiSix layer 43 and an LP-CVD SiN layer 44 are formed in this order on a gate oxide film 41. The gate oxide-film 41 is formed on a Si substrate 40.

As aforementioned, the TiSix layer 43 is crystallized in the high temperature process for forming the SiN layer 44. The state resulting from the inversion phenomenon due to the high temperature process is shown in FIG. 2.

The SiN layer 44 in FIG. 2 is thereafter patterned and used as an anti-etching mask to selectively etch the TiSix layer 43 and the polysilicon layer 42 in order to form a gate electrode. The inversion phenomenon having occurred during the formation of the SiN layer 44 will cause a disadvantage as below. Reference numeral 45 in FIG. 2 denotes that portion of the gate oxide film 41 which reacted with TiSix.

FIG. 3 is a perspective view partially in section, showing a state obtained after the gate electrode is patterned by RIE. As is evident from FIG. 3, etching pits 46 which degrade the quality (e.g. the breakdown voltage characteristic) of the gate oxide film 41 are formed in the gate oxide film 41 after the RIE process, because of reaction between the TiSix layer 43 and the gate oxide film 41 due to the inversion.

As described above, in the conventional case, the inversion phenomenon occurs due to the high temperature process during the formation of a laminated structure of TiSix and polysilicon, which makes it difficult to manufacture a semiconductor device with excellent electrical characteristics.

BRIEF SUMMARY OF THE INVENTION

The invention has been developed under the above-described circumstances, and aims to provide a semiconductor device which is free from the inversion phenomenon due to a high temperature process performed during the formation of a laminated structure of metal-silicide and polysilicon, and hence shows excellent electrical characteristics. The invention also aims to provide a method for manufacturing the semiconductor device.

According to a first aspect of the invention, there is provided a method of manufacturing a semiconductor device, comprising the steps of: preparing a semiconductor substrate with a polysilicon layer formed thereon; forming a first metal-silicide layer on the polysilicon layer; annealing the substrate in a non-oxidizing atmosphere to crystallize the first metal-silicide layer; and forming a second metal-silicide layer on the first metal-silicide layer.

According to a second aspect of the invention, there is provided a method of manufacturing a semiconductor device, comprising the steps of: preparing a semiconductor substrate with a polysilicon layer formed thereon; simultaneously forming a first metal-silicide layer on the polysilicon layer and annealing the substrate, both in a non-oxidizing atmosphere, to crystallize the first metal-silicide layer; and forming a second metal-silicide layer on the first metal-silicide layer.

According to a third aspect of the invention, there is provided a method of manufacturing a semiconductor device, comprising the steps of: forming a gate oxide film on a silicon semiconductor substrate; forming a polysilicon layer on the gate oxide film; forming a first metal-silicide layer on the polysilicon layer; annealing the substrate in a non-oxidizing atmosphere to crystallize the first metal-silicide layer; forming a second metal-silicide layer on the first metal-silicide layer; forming a silicon nitride film on part of the second metal-silicide layer; selectively removing the second and first metal-silicide layers and the polysilicon layer, using the silicon nitride film as a mask, to form a gate electrode; and forming an oxide film on the periphery of the gate electrode with the silicon nitride film kept to remain.

According to a fourth aspect of the invention, there is provided a method of manufacturing a semiconductor device, comprising the steps of: forming a gate oxide film on a silicon semiconductor substrate; forming a polysilicon layer on the gate oxide film; simultaneously forming a first metal-silicide layer on the polysilicon layer and annealing the substrate, both in a non-oxidizing atmosphere, to crystallize the first metal-silicide layer; forming a second metal-silicide layer on the first metal-silicide layer; forming a silicon nitride film on part of the second metal-silicide layer; selectively removing the second and first metal-silicide layers and the polysilicon layer, using the silicon nitride film as a mask, to form a gate electrode; and forming an oxide film on the periphery of the gate electrode with the silicon nitride film kept to remain.

According to a fifth aspect of the invention, there is provided a semiconductor device comprising: a silicon semiconductor substrate; a gate oxide film provided on the silicon semiconductor substrate; a gate electrode provided on the gate oxide film and including a polysilicon layer and first and second metal-silicide layers; and a silicon nitride film provided on the gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the invention will be described with reference to the accompanying drawings.

Figure 1A:
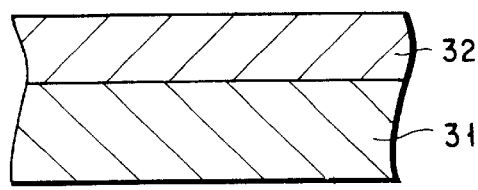
FIGS. 1A and 1B are sectional views, useful in explaining the mechanism of the conventional inversion phenomenon.
Figure 1B:
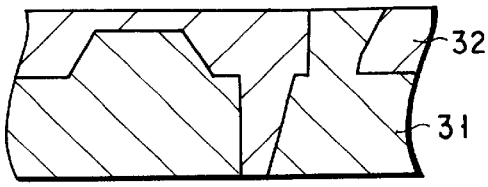
Figure 4A:
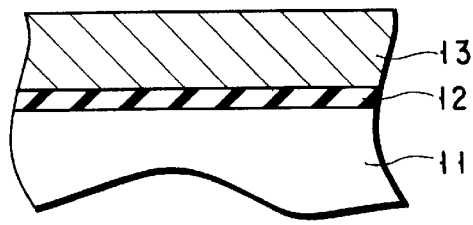
FIGS. 4A–4I are sectional views, useful in explaining a process for manufacturing a MOS semiconductor device according to an embodiment of the invention.

FIGS. 4A–4I are sectional views, useful in explaining a process for manufacturing a MOS semiconductor device according to the embodiment of the invention. First, a gate oxide film 12 is formed on a Si semiconductor substrate 11 which contains a predetermined impurity, as is shown in FIG. 4A. Then, a polysilicon layer 13 which contains an impurity is formed on the gate oxide film 12. The polysilicon layer 13 may be formed by depositing undoped polysilicon on the gate oxide film 12 and then implanting an impurity such as phosphorus (P) into the polysilicon layer 13 by ion implantation. Alternatively, the layer 13 may be formed by simultaneously performing deposition of polysilicon and diffusing an impurity into polysilicon by so-called In-Situ doping.

Figure 4B:
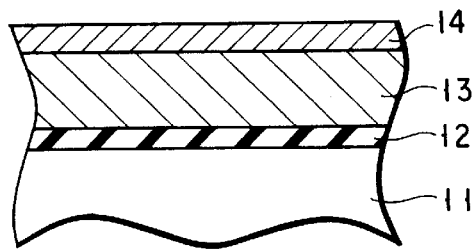

Subsequently, as is shown in FIG. 4B, a first TiSix layer 14 with a thickness of 70 nm or less, preferably 5–30 nm, is formed on the polysilicon layer 13 by sputtering, after a natural oxide film on the layer 13 is removed by an HF solution.

Thereafter, annealing is performed in a substantially vacuum atmosphere in the chamber for 1–5 minutes at 400° C. or more, preferably 500° C., at which the TiSix layer 14 is crystallized. It suffices if this annealing step is performed in a non-oxidizing atmosphere in which the TiSix layer 14 is not oxidized. In other words, the annealing step may be performed in an atmosphere containing Ar or $N_2$ gas or in the atmosphere of a forming gas, as well as in the aforementioned vacuum atmosphere.

Figure 4C:
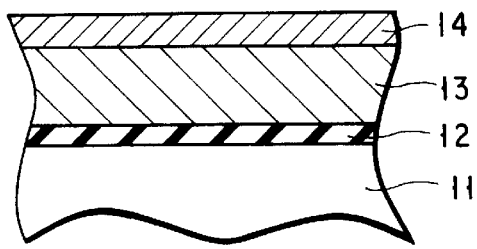

Although the TiSix layer 14 after the sputtering step is in an amorphous state, it is crystallized into a structure called "C49" after the annealing step, with the result that the boundary between the polysilicon layer 13 and the TiSix layer 14 is thermally stabilized as shown in FIG. 4C.

Figure 4D:
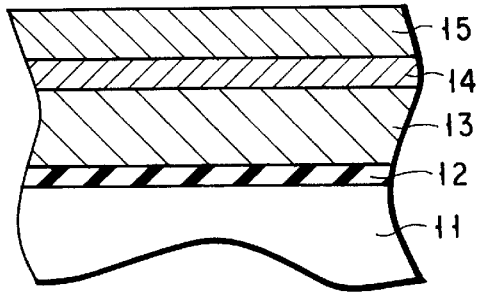

Thereafter, a second TiSix layer 15 with a thickness of 50–100 nm is formed on the first TiSix layer 14, using the same sputtering tool as in the first sputtering step, as is shown in FIG. 4D.

Figure 4E:
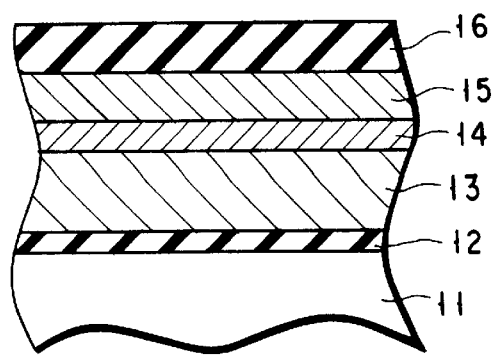

Then, an SiN film 16 is deposited on the overall surface of the resultant structure at 700–800° C. using the LP-CVD method, as is shown in FIG. 4E.

Figure 4F:
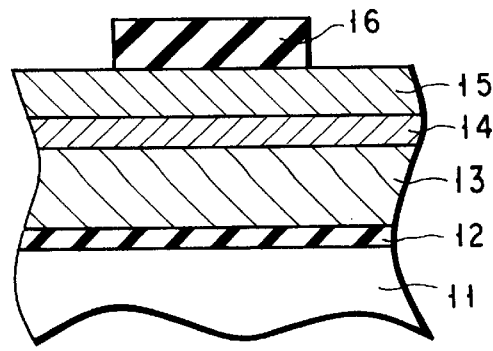
Figure 2:
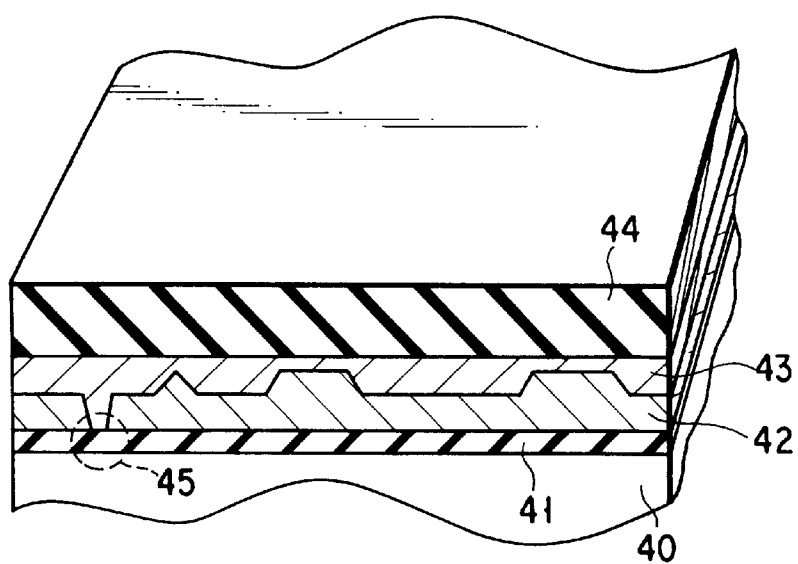
FIG. 2 is a perspective view, showing a state seen while a gate electrode consisting of polysilicon and TiSix is formed on a gate oxide film by the conventional method.
Figure 3:
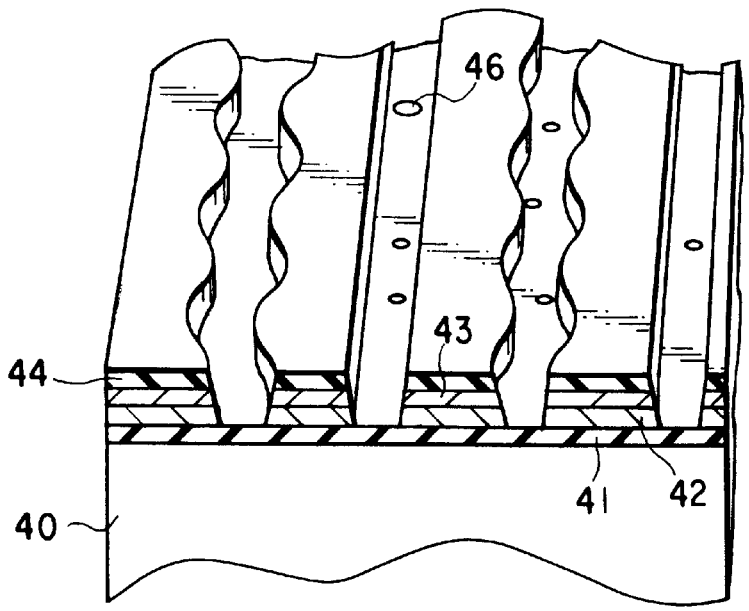
FIG. 3 is a perspective view partially in section, showing a state obtained after a gate electrode is patterned by RIE in the conventional method.

As is shown in FIG. 4F, part of the SiN film 16 is selectively left on the TiSix layer 15 using the lithography technique and the RIE method. The left SiN film 16 is used as an anti-etching mask in the step of etching TiSix and polysilicon.

Figure 4G:
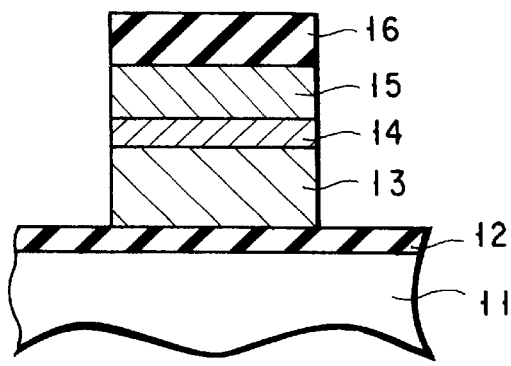

As is shown in FIG. 4G, the second and first TiSix layers 15 and 14 and the polysilicon layer 13 are selectively removed by the RIE step using the SiN layer 16 as a mask, thereby patterning a gate electrode.

Figure 4H:
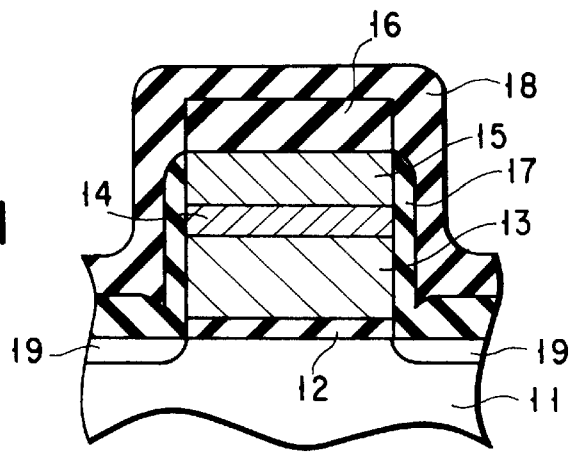

Then, as is shown in FIG. 4H, the overall surface of the resultant structure is oxidized to form a thin post-oxide film 17 on the periphery of the gate electrode and on the substrate in order to compensate damages on the substrate 11 due to the RIE patterning, then the Si semiconductor substrate 11 is doped, with the patterned gate electrode used as a mask, with an impurity which has a conductivity opposite to the impurity contained in the Si semiconductor substrate 11, and an SiN film 18 is deposited on the overall surface by the LP-CVD method at 780° C. As a result, the implanted impurity is diffused in the substrate 11 to thereby form source/drain diffusion layers 19.

Figure 4I:
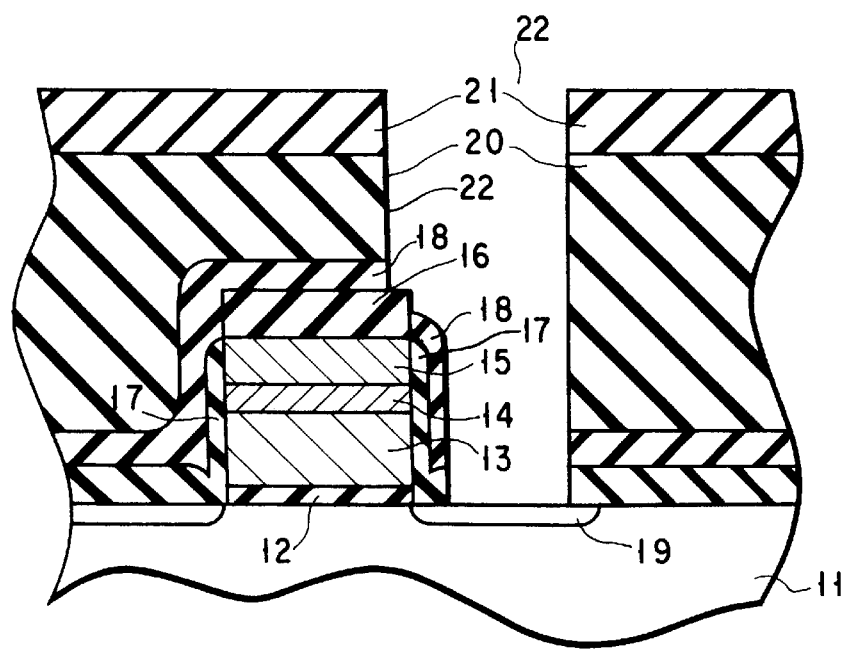

Thereafter, as is shown in FIG. 4I, an interlayer insulating film 20 formed of PSG (phosphorous silicate glass) or BPSG (boron-phosphorous silicate glass) is deposited on the overall surface of the resultant structure, and an SiN film 21 is deposited on the overall surface of the film 20 using the LP-CVD method. Subsequently, part of the SiN layer 21 is left on the interlayer insulating film 20 by the PEP method, and is used as an anti-etching mask to etch the interlayer insulating film 20 by the RIE method, in order to form a contact hole 22 which extends to one of the source/drain diffusion region 19. Thereafter, a conductive material which will constitutes an electrode, such as aluminum, is deposited on the overall surface, and etched such that the material is left only in the hole and on its peripheral portion. Thus, a source/drain electrode is formed.

In the above-described method, a TiSix layer with a necessary thickness is provided by forming the first TiSix layer 14 on the polysilicon layer 13, then annealing the resultant structure, and forming the second TiSix layer 15 on the annealed structure. When annealing is performed after the formation of the first TiSix layer 14, the TiSix layer 14 is crystallized, which renders the boundary between the layer 14 and the polysilicon layer 13 to a thermally stabilized state. Therefore, even if a high temperature treatment such as formation of the SiN film 16 by the LP-CVD method is performed, the inversion phenomenon which will cause TiSix grains to be formed under polysilicon is not liable to occur.

Figure 5:
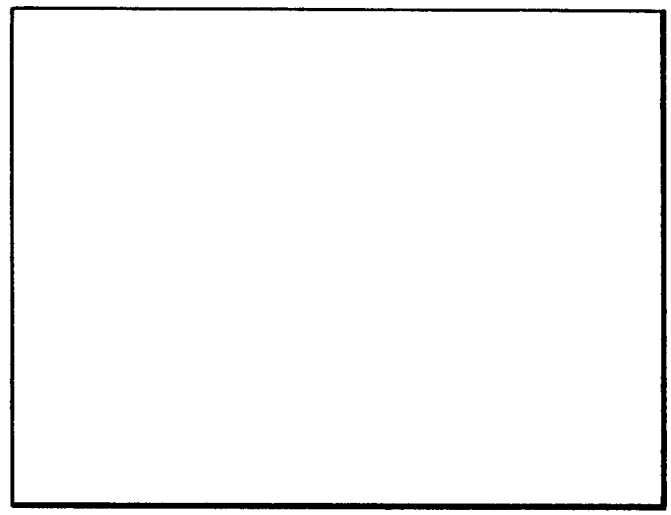
FIG. 5 is a view, showing that surface portion of a second TiSix layer obtained after annealing in the embodiment, which is enlarged by an optical microscope.

FIG. 5 is a view, showing a surface of the TiSix layer enlarged by an optical microscope and obtained in the embodiment by forming a TiSix layer 14 with a thickness of 30 nm by first sputtering, then annealing the resultant structure at 500° C., forming a TiSix layer 15 with a thickness of 70 nm by second sputtering, and annealing the resultant structure at 1050° C. as an accelerating experiment temperature which is higher than the normally used. As is evident from FIG. 5, the inversion phenomenon in which polysilicon grains occur is found in a very small number of portions of the surface.

Figure 6:
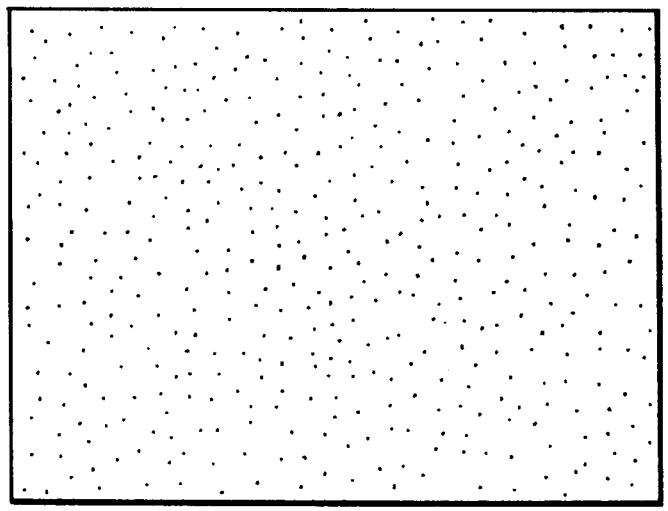
FIG. 6 is a view, showing that surface portion of a TiSix layer obtained after annealing in the case of using the conventional method, which is enlarged by the optical microscope.

On the other hand, FIG. 6 a view, showing a surface of the TiSix layer enlarged by the optical microscope and obtained in the conventional case by forming a TiSix layer with a thickness of 100 nm by sputtering, and then annealing the resultant structure at 1050° C. As is evident from FIG. 6, the inversion phenomenon is found in many portions of the surface.

Figure 7:
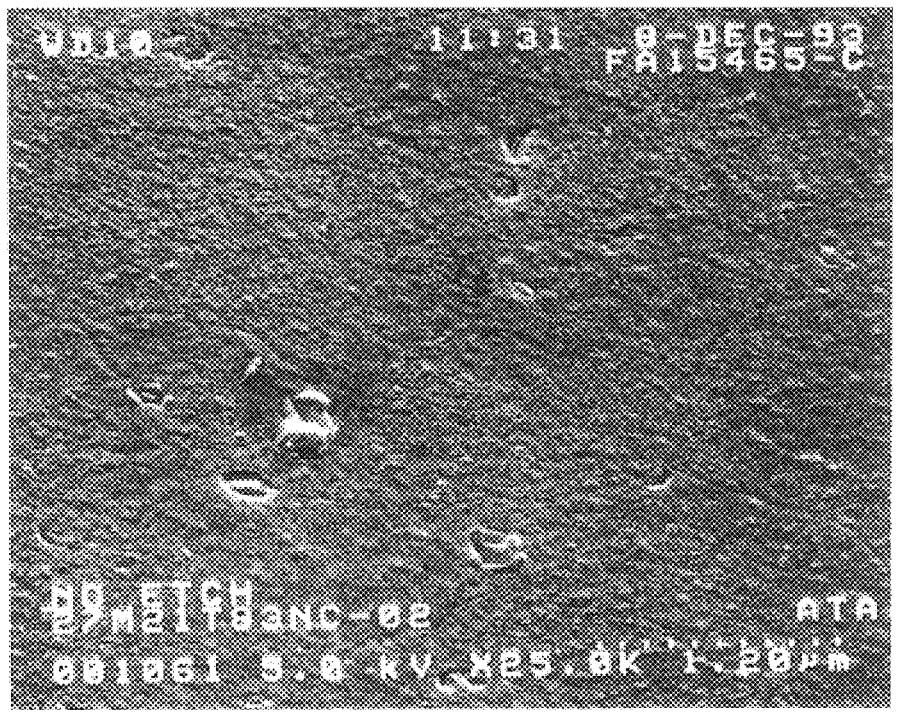
FIG. 7 is a picture taken by a scanning electron microscope, showing a surface of a TiSix layer formed in the embodiment under the same conditions as the case of FIG. 5.
Figure 8:
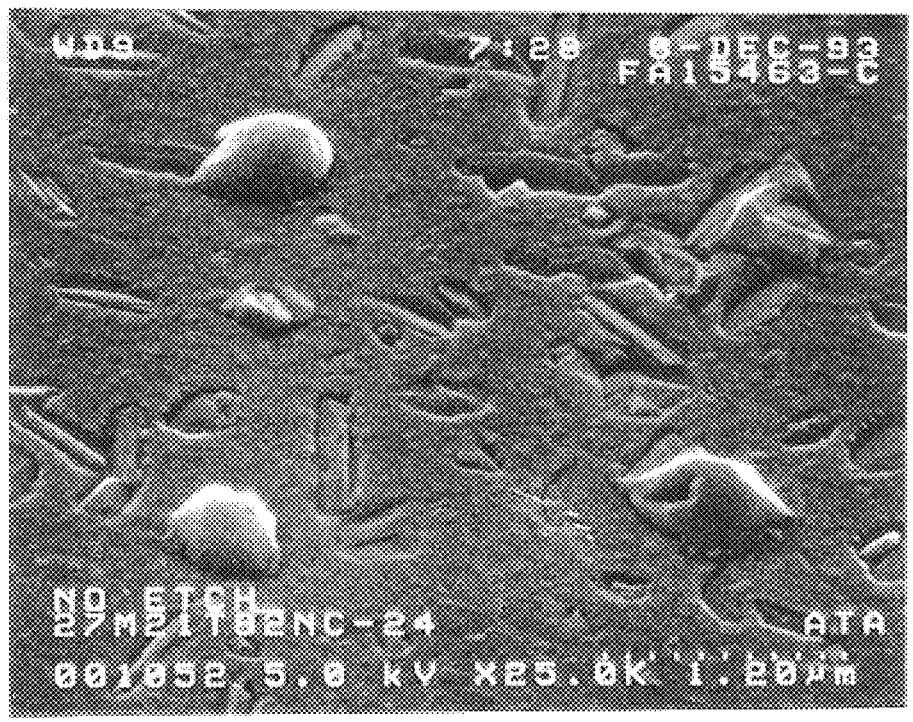
FIG. 8 is a picture taken by a scanning electron microscope, showing a surface of a TiSix layer formed under the same conditions as the case of FIG. 6.

FIG. 7 is a picture taken by a scanning electron microscope (SEM), showing a surface of a TiSix layer formed in the embodiment under the same conditions as the case of FIG. 5. FIG. 8 is a picture taken by the scanning electron microscope, showing a surface of a TiSix layer formed under the same conditions as the case of FIG. 6. It is also evident from FIGS. 7 and 8 that the inversion phenomenon is found, even after the accelerating high-temperature treatment, in far fewer portions in the present invention than in the conventional case.

Since in the invention, the occurrence of the inversion phenomenon can be restrained, the sheet resistance of the gate electrode can be sufficiently reduced, and degradation of the quality of the gate oxide film can be avoided.

Moreover, as is shown in FIG. 4I, the SiN film 16 used in the step of FIG. 4F remains on an upper portion of the gate electrode when the interlayer insulating film 20 is etched using the SiN film 21 as an anti-etching mask, to form the contact hole 22. Since the remaining SiN film 16 and SiN film 18 serve as an etching block at the time of etching the interlayer insulating film 20, even if the mask is displaced to a portion in which the hole 22 is to be formed and the position of the hole is displaced to the gate electrode side as shown in FIG. 4I, the TiSix layer 15 located below the SiN film 16 is not etched. Further, the post-oxide film 17 and the SiN film 18 partially remain on the side wall of the gate electrode. This can realize a borderless contact which makes it not necessary to separate the gate electrode and the source/drain electrode from each other.

It is a matter of course that the invention is not limited to the above-described embodiment, but may be modified in various manners. For example, although in the embodiment, annealing is performed after first sputtering for the first TiSix layer, it may be modified such that the first sputtering is performed at 500° C. at which TiSix is crystallized. In this case, the second sputtering should be performed at 400° C. or less.

Moreover, although in the embodiment, the invention is applied to the formation of the gate electrode, it can also be applied to the formation of salicide on polysilicon or on a diffusion region of the Si substrate.

In addition, although in the embodiment, the TiSix layer is formed on the polysilicon layer, a NiSix layer, CoSix layer, a pure Ti or pure Co layer may be formed in place of the TiSix layer.

As described above, the invention provides a semiconductor device which is free from the inversion phenomenon due to a high temperature process during the formation of a laminated structure of metal-silicide and polysilicon, and hence has excellent electrical characteristics. The invention also provides a method for manufacturing the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising the steps of:

preparing a semiconductor substrate with a polysilicon layer formed thereon;

forming a first metal-silicide layer on the polysilicon layer;

annealing the substrate in a non-oxidizing atmosphere to crystallize the first metal-silicide layer; and forming a second metal-silicide layer on the first metal-silicide layer.

2. A method of manufacturing a semiconductor device, comprising the steps of:

preparing a semiconductor substrate with a polysilicon layer formed thereon;

simultaneously forming a first metal-silicide layer on the polysilicon layer and annealing the substrate, both in a non-oxidizing atmosphere, to crystallize the first metal-silicide layer; and forming a second metal-silicide layer on the first metal-silicide layer.

3. A method according to claim 1, wherein the first and second metal-silicide layer are formed of titanium silicide.

4. A method according to claim 3, wherein the titanium silicide is deposited by sputtering.

5. A method according to claim 2, wherein the first and second metal-silicide layer are formed of titanium silicide.

6. A method according to claim 5, wherein the titanium silicide is deposited by sputtering.

7. A method according to claim 1, wherein the first metal-silicide layer has a thickness of 5–70 nm.

8. A method according to claim 1, wherein the first metal-silicide layer has a thickness of 5–30 nm.

9. A method according to claim 2, wherein the first metal-silicide layer has a thickness of 5–70 nm.

10. A method according to claim 2, wherein the first metal-silicide layer has a thickness of 5–30 nm.

11. A method according to claim 1, wherein the second metal-silicide layer has a thickness of 30–100 nm.

12. A method according to claim 2, wherein the second metal-silicide layer has a thickness of 30–100 nm.

13. A method according to claim 1, wherein the substrate is annealed for 1–5 minutes at 400° C. or more at which the first metal-silicide layer is crystallized.

14. A method according to claim 2, wherein the substrate is annealed for 1–5 minutes at 400° C. or more at which the first metal-silicide layer is crystallized.

15. A method according to claim 1, wherein the substrate is annealed for 1–5 minutes at 500° C.

16. A method according to claim 2, wherein the substrate is annealed for 1–5 minutes at 500° C.

17. A method according to claim 1, wherein the non-oxidizing atmosphere is one of a substantially vacuum atmosphere, an atmosphere which contains argon or nitrogen, and an atmosphere of a forming gas.

18. A method according to claim 2, wherein the non-oxidizing atmosphere is one of a substantially vacuum atmosphere, an atmosphere which contains argon or nitrogen, and an atmosphere of a forming gas.

19. A method of manufacturing a semiconductor device, comprising the steps of:

forming a gate oxide film on a silicon semiconductor substrate;

forming a polysilicon layer on the gate oxide film;

forming a first metal-silicide layer on the polysilicon layer;

annealing the substrate in a non-oxidizing atmosphere to crystallize the first metal-silicide layer;

forming a second metal-silicide layer on the first metal-silicide layer;

forming a silicon nitride film on part of the second metal-silicide layer;

selectively removing the second and first metal-silicide layers and the polysilicon layer, using the silicon nitride film as a mask, to form a gate electrode; and forming an oxide film on the periphery of the gate electrode with the silicon nitride film kept to remain.

20. A method of manufacturing a semiconductor device, comprising the steps of:

forming a gate oxide film on a silicon semiconductor substrate;

forming a polysilicon layer on the gate oxide film;

simultaneously forming a first metal-silicide layer on the polysilicon layer and annealing the substrate, both in a non-oxidizing atmosphere, to crystallize the first metal-silicide layer;

forming a second metal-silicide layer on the first metal-silicide layer;

forming a silicon nitride film on part of the second metal-silicide layer;

selectively removing the second and first metal-silicide layers and the polysilicon layer, using the silicon nitride film as a mask, to form a gate electrode; and forming an oxide film on the periphery of the gate electrode with the silicon nitride film kept to remain.

21. A method according to claim 19, wherein the first and second metal-silicide layer are formed of titanium silicide.

22. A method according to claim 20, wherein the first and second metal-silicide layer are formed of titanium silicide.

23. A method according to claim 21, wherein the titanium silicide is deposited by sputtering.

24. A method according to claim 22, wherein the titanium silicide is deposited by sputtering.

25. A method according to claim 19, wherein the first metal-silicide layer has a thickness of 5–70 nm.

26. A method according to claim 20, wherein the first metal-silicide layer has a thickness of 5–70 nm.

27. A method according to claim 19, wherein the first metal-silicide layer has a thickness of 5–30 nm.

28. A method according to claim 20, wherein the first metal-silicide layer has a thickness of 5–30 nm.

29. A method according to claim 19, wherein the second metal-silicide layer has a thickness of 30–100 nm.

30. A method according to claim 20, wherein the second metal-silicide layer has a thickness of 30–100 nm.

31. A method according to claim 19, wherein the substrate is annealed for 1–5 minutes at 400° C. or more at which the first metal-silicide layer is crystallized.

32. A method according to claim 20, wherein the substrate is annealed for 1–5 minutes at 400° C. or more at which the first metal-silicide layer is crystallized.

33. A method according to claim 19, wherein the substrate is annealed for 1–5 minutes at 500° C.

34. A method according to claim 20, wherein the substrate is annealed for 1–5 minutes at 500° C.

35. A method according to claim 19, wherein the non-oxidizing atmosphere is one of a substantially vacuum atmosphere, an atmosphere which contains argon or nitrogen, and an atmosphere of a forming gas.

36. A method according to claim 20, wherein the non-oxidizing atmosphere is one of a substantially vacuum atmosphere, an atmosphere which contains argon or nitrogen, and an atmosphere of a forming gas.

* * * * *